United States Patent [19]
Gotou

[11] Patent Number: 4,904,570
[45] Date of Patent: Feb. 27, 1990

[54] METHOD OF USING A PROJECTION ALIGNER FOR PHOTOETCHING

[75] Inventor: Akio Gotou, Nara, Japan

[73] Assignee: Sharp Kabushiki Kaisha, Osaka, Japan

[21] Appl. No.: 309,904

[22] Filed: Feb. 9, 1989

Related U.S. Application Data

[63] Continuation of Ser. No. 220,445, Jul. 13, 1988, abandoned, which is a continuation of Ser. No. 23,982, Mar. 12, 1987, abandoned, which is a continuation of Ser. No. 818,010, Jan. 13, 1986, abandoned.

[30] Foreign Application Priority Data

Feb. 15, 1985 [JP] Japan ............................ 60-29136

[51] Int. Cl.⁴ .......................................... G03C 5/00
[52] U.S. Cl. .................................. 480/322; 430/22; 430/311; 355/77
[58] Field of Search ............ 430/22, 311, 322, 327; 355/72, 77

[56] References Cited

U.S. PATENT DOCUMENTS

| | | | |
|---|---|---|---|
| 4,068,947 | 1/1978 | Buckley et al. | 355/72 |
| 4,198,159 | 4/1980 | Cachon | 355/55 |
| 4,518,678 | 5/1985 | Allen | 430/311 |

*Primary Examiner*—José G. Dees
*Attorney, Agent, or Firm*—Flehr, Hohbach, Test, Albritton & Herbert

[57] ABSTRACT

When a circuit pattern for a semiconductor device is exposed on a substrate with a coating of photoresist by using a projection aligner with positioning pads to properly position the substrate, photoresist is removed from such areas on the substrate that are expected to come in direct contact with the pads. The removing is effected before the substrate is exposed so that accumulation of photoresist on the pads can be prevented and substrates to be exposed subsequently can also be positioned accurately by using the projection aligner.

6 Claims, 2 Drawing Sheets

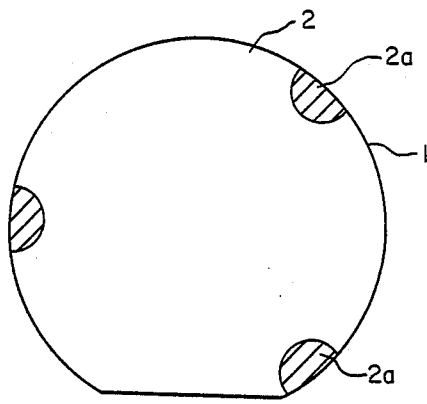
FIG.—1
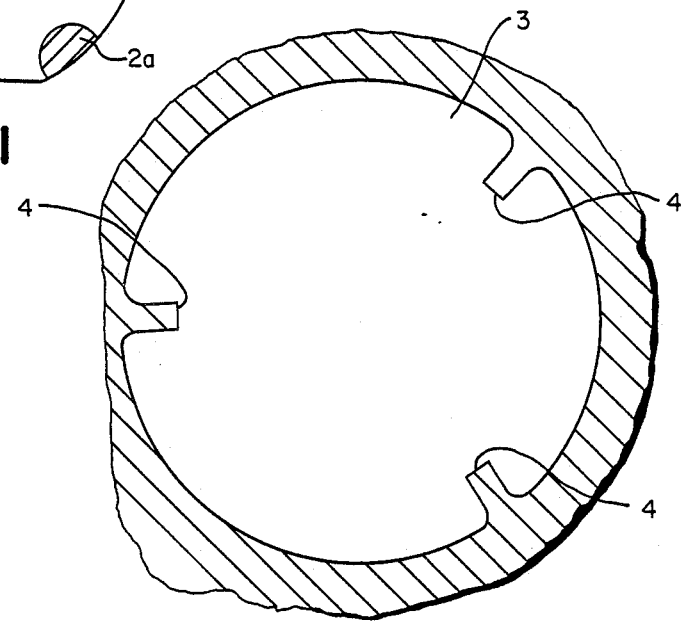
FIG.—2
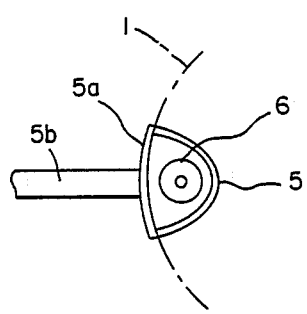
FIG.—3A

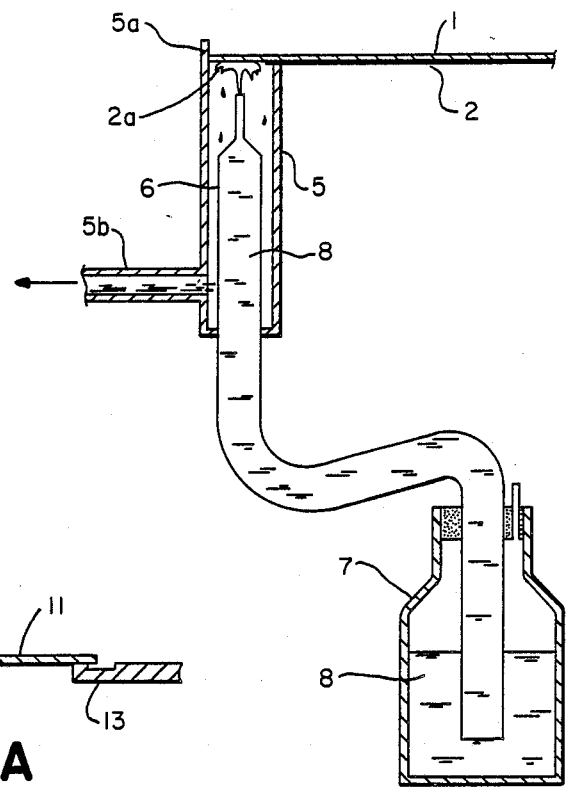
FIG. -3B
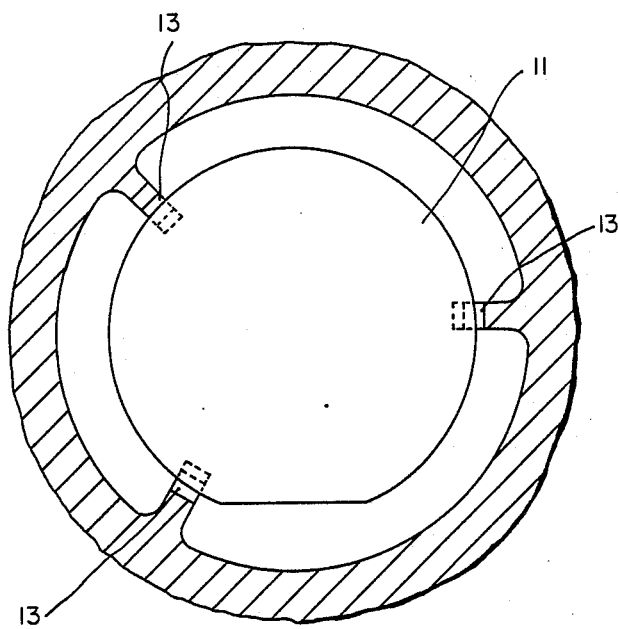
FIG. -4A
FIG. -4B

METHOD OF USING A PROJECTION ALIGNER FOR PHOTOETCHING

This is a continuation of application Ser, No. 220,445, filed July 13, 1988, abandoned, which is a continuation of application Ser. No. 023,982, filed Mar. 12, 1987, abandoned, which is a continuation of application Ser. No. 818,010, filed Jan. 13, 1986, now abandoned.

This invention relates to a photoetching process for forming circuit patterns for a semiconductor device and more particularly to a method for preventing fluctuations in the position of the focus of a projection aligner used in a photoetching process.

Photoetching has been a common method of forming very fine circuit patterns for a semiconductor device and the like. According to this method, a coating of photoresist is applied on the surface of a substrate and after an ultraviolet light beam is used to project a desired pattern on the photoresist layer, it is developed and the pattern is formed by etching. An optical system comprising lenses, a reflective mirror such as a projection aligner or a combination of lenses and mirrors is typically used for the exposure but a problem of the following type is encountered if use is made of a conventional projection aligner.

In order to form an image of a pattern accurately on the photoresist layer covering a substrate, the substrate is generally placed on three or four positioning pads with its surface covered with photoresist facing the downward direction as shown in FIG. 4A which is a cross-sectional view and FIG. 4B which is a plan view wherein numerals 11, 12 and 13 respectively indicate the substrate, its surface covered with photoresist and the pads. Since the pad 13 and the photoresist on the substrate 11 are thus directly in contact with respect to each other, the photoresist on those parts of the substrate 11 may become attached to the pads 13, depending in part on the surface characteristics of the substrate 11. After many substrates are exposed, the amount of photoresist deposited on the pads 13 will increase and such accumulated photoresist tends to adversely affect the focusing of the pattern image on the substrate 11. Poor resolution means variations in the dimensions and deformations of the produced pattern. In extreme situations in the case of a semiconductor device, it can result in short circuiting or open circuiting.

It is therefore an object of the present invention in view of the possibilities described above to prevent photoresist on substrates from becoming attached to the pads of a projection aligner used in a photoetching process so that focus fluctuations of the projection aligner caused by the photoresist deposited on the pads can be prevented.

The above and other objects of the present invention are achieved by preliminarily removing photoresist from those areas on the surface of each substrate which are expected to come into direct contact with the positioning pads of the projection aligner before the substrate is placed inside the projection aligner for exposure, thereby preventing photoresist from becoming deposited on the pads.

The accompanying drawings, which are incorporated in and form a part of this specification, illustrate an embodiment of the present invention and, together with the description, serve to explain the principles of the invention.

BRIEF DESCRIPTION OF THE DRAWINGS

FIG. 1 is a plan view of a substrate on which the method of the present invention can be applied.

FIG. 2 is a bottom view of a part of a projection aligner where a substrate to be exposed is set according to the method of this invention.

FIGS. 3A and 3B are respectively a plan view and a side view of an apparatus for removing photoresist according to an embodiment of this invention.

FIG. 4A is a cross-sectional side view of a substrate set in a projection aligner for exposure and FIG. 4B is a bottom view of the same.

A method embodying the present invention is described with reference firstly to FIGS. 1 and 2 wherein numeral 1 indicates a substrate with a coating of photoresist 2 covering its surface. Such a substrate may be fabricated, for example, by applying photoresist by the spin coating method and then sintering and drying it at specified temperatures. Before such a substrate is positioned in a projection aligner, however, photoresist is removed from such areas 2a of the substrate 1 which are expected to come in contact with the positioning pads 4 of the aligner. In FIG. 2, numeral 3 indicates an opening in the projection aligner where substrates to be exposed are positioned as shown in FIG. 4.

In order to remove photoresist from such corresponding areas 2a, use may be made of an apparatus shown in FIGS. 3A and 3B wherein numeral 5 indicates a chuck or a tubular container with a bottom. The chuck 5 has its top end open and its cross-sectional shape is approximately the same as that of the area 2a on the substrate 1 from which photoresist is to be removed. The substrate 1 to be processed is placed on top of the chuck 5 with the surface covered with photoresist 2 facing in the downward direction in such a way that one of the target areas 2a from which photoresist is going to be removed will coincide with its top opening. In order to facilitate such positioning of a substrate, a protruding section 5a is provided along a portion of the top periphery of the chuck 5 such that the substrate 1, when properly positioned, will be in contact with this protruding section 5a as shown in FIGS. 3A and 3B.

Inside the chuck 5, there is a liquid-transporting tube 6 with a jet nozzle inserted from below for spraying the target area 2a of the substrate 1 with a washing liquid 8. For this purpose, the tube 6 is so positioned that the nozzle is near the center of the top opening of the chuck 5. A suitable solvent is selected as the washing liquid, depending on the type of the photoresist to be removed. The bottom end of the liquid-transporting tube 6 is inside a tank 7 storing the washing liquid 8.

The chuck 5 is further provided with an outlet 5b on its side wall near the bottom. The purpose of this outlet 5b is to reduce the pressure inside the chuck 5 by removing therethrough the air inside the chuck 5 so that the liquid 8 inside the tank 7 is caused to spring out of the nozzle and spray the substrate 1 and photoresist is removed and washed away from the target area 2a. The waste liquid is removed from the interior of the chuck 5 through the outlet 5b.

The foregoing description of a preferred embodiment of the present invention has been presented for purposes of illustration and description. It is not intended to be exhaustive or to limit the invention to the precise form disclosed, and obviously many modifications and variations are possible in light of the above teaching. For example, it is preferable to provide as many units of the apparatus of FIG. 3 as there are areas on the substrate from which photoresist is to be removed and to arrange them so that photoresist can be removed simultaneously from all such areas. Moreover, the specific apparatus for removing photoresist shown in FIG. 3 is not intended to limit the scope of this invention. Photoresist may be removed alternatively by wiping the substrate surface with a sponge-like substance or a fiber-like substance impregnated with a washing liquid. In summary, the present invention teaches to remove photoresist from such areas of substrates which are expected to directly touch the pads of the projection aligner serving to position the substrates to be exposed. Accumulation of photoresist on these pads is thus prevented so that the substrates can always be positioned correctly in the projection aligner. As a result, fluctuations in dimensions and deformation of pattern can be prevented and the quality of final products can be improved.

What is claimed is:

1. In a photoetching process on a substrate having a surface covered with photoresist, a method of using a projection aligner having positioning pads for correctly positioning a substrate to be exposed by placing said substrate against said positioning pads, said method comprising the steps of placing a substrate on a chuck having an open top end such that one of mutually separated peripheral areas as of said substrate covered with photoresist and intended to come into contact with one of said positioning pads covers said open top end of said chuck, said chuck having inserted therein a tube having a jet nozzle, spraying said one of peripheral areas of said substrate with a washing liquid ejected through said jet nozzle of said tube so as to remove said photoresist from said one of peripheral areas of said substrate, similarly removing said photoresist from the others of said peripheral areas, thereby removing said photoresist only from selected mutually separated peripheral areas of said substrate corresponding to the positions of said pads, and thereafter placing said substrate on said projection aligner such that said mutually separated peripheral areas of said substrate are in contact with and supported by said positioning pads.

2. The photoetching process of claim 1 wherein said mutually separated peripheral areas are three areas substantially at equidistance from one another.

3. The photoetching process of claim 1 wherein said projection aligner supports said substrate by three positioning pads which are equally spaced around the periphery of said substrate.

4. The photoetching process of claim 1 wherein said photoresist is removed from said peripheral areas simultaneously.

5. The photoetching process of claim 1 wherein said chuck has a cross-sectional shape substantially the same as the shape of said positioning pad.

6. The photoetching process of claim 1 wherein a portion of a wall around said open top end is formed protrudingly higher so as to serve as a positioning guide for said substrate.

* * * * *